US010879798B2

(12) United States Patent
Hung et al.

(10) Patent No.: US 10,879,798 B2
(45) Date of Patent: Dec. 29, 2020

(54) CHARGE PUMP CIRCUIT WITH CAPACITOR SWAPPING TECHNIQUE AND ASSOCIATED METHOD

(71) Applicant: MEDIATEK INC., Hsin-Chu (TW)

(72) Inventors: Chao-Ching Hung, Hsin-Chu (TW); Yu-Li Hsueh, Hsin-Chu (TW); Kai-Ren Fong, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/516,188

(22) Filed: Jul. 18, 2019

(65) Prior Publication Data

US 2020/0067405 A1    Feb. 27, 2020

Related U.S. Application Data

(60) Provisional application No. 62/722,234, filed on Aug. 24, 2018.

(51) Int. Cl.
*H03L 7/089* (2006.01)
*H02M 3/07* (2006.01)

(52) U.S. Cl.
CPC .......... *H02M 3/073* (2013.01); *H03L 7/0895* (2013.01)

(58) Field of Classification Search
CPC ..... H02M 3/073; H03L 7/0895; H03L 7/0896
See application file for complete search history.

(56) References Cited

U.S. PATENT DOCUMENTS

| 8,183,900 B2 * | 5/2012 | Lamanna ............... H03L 7/1974 327/148 |
| 9,331,569 B1 | 5/2016 | Chiu |
| 9,397,557 B2 | 7/2016 | Chiu |
| 9,806,724 B1 | 10/2017 | Sharifzadeh |
| 2007/0090863 A1 | 4/2007 | Hsu |
| 2015/0333623 A1 | 11/2015 | Chiu |

FOREIGN PATENT DOCUMENTS

| CN | 101335521 A | 12/2008 |
| CN | 105356877 A | 2/2016 |
| CN | 105790572 A | 7/2016 |
| CN | 105814797 A | 7/2016 |
| WO | 2009/109638 A1 | 9/2009 |
| WO | 2009109638 A1 | 9/2009 |
| WO | 2016/015673 A1 | 2/2016 |

* cited by examiner

*Primary Examiner* — Jung Kim
(74) *Attorney, Agent, or Firm* — Winston Hsu

(57) ABSTRACT

A charge pump circuit includes first and second capacitors, first and second controllable current generating circuits, and an interconnection circuit. A first terminal of the first controllable current generating circuit is coupled to a first plate of the first capacitor. A first terminal of the second controllable current generating circuit is coupled to a first plate of the second capacitor. During a first operation mode, the first controllable current generating circuit refers to a first control input for selectively providing a first current, and the second controllable current generating circuit refers to a second control input for selectively providing a second current. During a second operation mode, the interconnection circuit couples the first plate of the second capacitor to a first power rail, and couples both of the second plate of the second capacitor and the first plate of the first capacitor to an output terminal.

11 Claims, 12 Drawing Sheets

CHARGE PUMP CIRCUIT WITH CAPACITOR SWAPPING TECHNIQUE AND ASSOCIATED METHOD

CROSS REFERENCE TO RELATED APPLICATIONS

This application claims the benefit of U.S. provisional application No. 62/722,234, filed on Aug. 24, 2018 and incorporated herein by reference.

BACKGROUND

The present invention relates to a charge pump design, and more particularly, to a charge pump circuit with a capacitor swapping technique and an associated method.

Phase-locked loop (PLL) circuit is one of the most inevitable necessities in modern electronic systems. For example, PLL circuits can be used in applications of clock generation, time synchronization, clock multiplication, etc. A low-voltage PLL circuit becomes essential for certain low-voltage applications. Atypical PLL circuit may include a phase-frequency detector (PFD) circuit, a charge pump (CP) circuit, a loop filter, a controllable oscillator circuit (e.g., a voltage-controlled oscillator), and a feedback circuit (e.g., a frequency divider). The charge pump circuit is used for adjusting a control voltage that is provided to the controllable oscillator circuit via the loop filter. A conventional charge pump circuit may include a pull-up circuit and a pull-down circuit, each having a current source to provide a charging/discharging current. Both of the pull-up circuit and the pull-down circuit are used to adjust the control voltage therebetween, where the control voltage is used as an output voltage of the conventional charge pump circuit.

A current source of the pull-up circuit and a current source of a pull-down circuit may be implemented by metal-oxide-semiconductor field-effect transistors (MOS transistors). Ideally, the MOS transistors are biased to operate in a saturation mode. Since the control voltage at the output terminal of the conventional charge pump circuit directly affects operation states of the MOS transistors in the pull-up circuit and the pull-down circuit, the control voltage should be limited within a proper operating range so as to make the MOS transistors operate in an appropriate work mode (e.g., saturation mode). Generally, if the conventional charge pump circuit has a supply voltage V1 (e.g., +3.3V) and a ground voltage V2 (e.g., 0V) and each MOS transistor therein has a positive overdrive voltage $V_{OV}$ (which is equal to a gate-source voltage $V_{GS}$ minus a threshold voltage $V_{TH}$), the control voltage should be limited by an upper boundary V1−$V_{OV}$ (i.e., supply voltage V1 minus overdrive voltage $V_{OV}$) and a lower boundary V2+$V_{OV}$ (i.e., ground voltage V2 plus overdrive voltage $V_{OV}$) to ensure that MOS transistors in the pull-up circuit and the pull-down circuit operate in the saturation mode to act as current sources. In other words, the operating range of the control voltage at the output terminal of the conventional charge pump circuit is substantially equal to V1−V2−2*$V_{OV}$, and it is extremely narrow and not suitable for a low-voltage application.

There is a trade-off between noise performance and operation range of the conventional charge pump circuit. For example, to reduce noise resulting from current sources of the conventional charge pump circuit, one solution is to increase the overdrive voltage $V_{OV}$ at the expense of the operating range of the control voltage. When the conventional charge pump circuit is employed in a low-voltage application, it is required to operate with a narrow operating range of the control voltage. Thus, there is a need for an innovative charge pump circuit design which is capable of breaking a trade-off between noise performance and operation range for a low-voltage and low-noise application.

SUMMARY

One of the objectives of the claimed invention is to provide a charge pump circuit with a capacitor swapping technique and an associated method.

According to a first aspect of the present invention, an exemplary charge pump circuit is disclosed. The exemplary charge pump circuit is used for adjusting a control voltage at an output terminal, and includes a first capacitor, a second capacitor, a first controllable current generating circuit, a second controllable current generating circuit, and an interconnection circuit. The first capacitor has a first plate and a second plate. The second capacitor has a first plate and a second plate. The first controllable current generating circuit has a first terminal and a second terminal, wherein the first terminal of the first controllable current generating circuit is coupled to the first plate of the first capacitor, and during a first operation mode of the charge pump circuit, the first controllable current generating circuit is arranged to refer to a first control input for selectively providing a first current passing through the first terminal and the second terminal of the first controllable current generating circuit. The second controllable current generating circuit has a first terminal and a second terminal, wherein the first terminal of the second controllable current generating circuit is coupled to the first plate of the second capacitor, and during the first operation mode of the charge pump circuit, the second controllable current generating circuit is arranged to refer to a second control input for selectively providing a second current passing through the first terminal and the second terminal of the second controllable current generating circuit. During a second operation mode of the charge pump circuit, the interconnection circuit is arranged to at least couple the first plate of the second capacitor to a first power rail, and is further arranged to couple both of the second plate of the second capacitor and the first plate of the first capacitor to the output terminal of the charge pump circuit.

According to a second aspect of the present invention, an exemplary method for adjusting a control voltage at an output terminal of a charge pump circuit is disclosed. The exemplary method includes: providing the charge pump circuit that comprises a first capacitor, a second capacitor, a first controllable current generating circuit, and a second controllable current generating circuit, wherein a first terminal of the first controllable current generating circuit is coupled to a first plate of the first capacitor, and a first terminal of the second controllable current generating circuit is coupled to a first plate of the second capacitor; during a first operation mode of the charge pump circuit, referring to a first control input for selectively enabling the first controllable current generating circuit to provide a first current passing through the first terminal and a second terminal of the first controllable current generating circuit, and referring to a second control input for selectively enabling the second controllable current generating circuit to provide a second current passing through the first terminal and a second terminal of the second controllable current generating circuit; and during a second operation mode of the charge pump circuit, coupling the first plate of the second capacitor to a first power rail, coupling a second plate of the second capacitor to the output terminal of the charge pump circuit, and coupling the first plate of the first capacitor to the output terminal of the charge pump circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
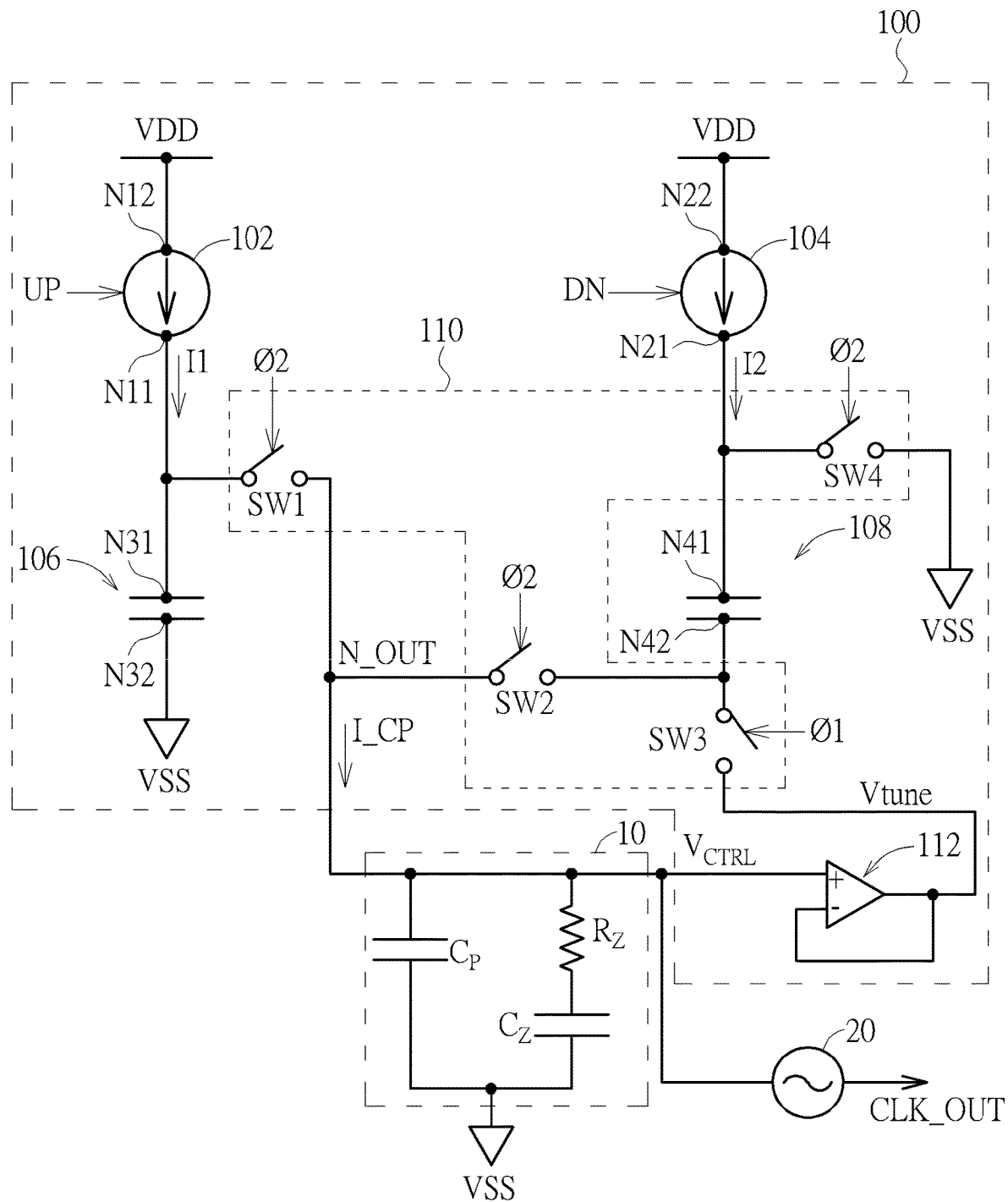
FIG. 1 is a diagram illustrating a first charge pump circuit according to an embodiment of the present invention.

FIG. 1 is a diagram illustrating a first charge pump circuit according to an embodiment of the present invention. The charge pump circuit 100 includes a plurality of controllable current generating circuits 102, 104, a plurality of capacitors 106, 108, an interconnection circuit 110, and an optional buffer circuit 112. The charge pump circuit 100 is used for adjusting a control voltage $V_{CTRL}$ at an output terminal N_OUT of the charge pump circuit 100. The controllable current generating circuit 102 is arranged to refer to a control input UP for selectively providing a current I1 passing through two terminals N11 and N12 of the controllable current generating circuit 102. The controllable current generating circuit 104 is arranged to refer to a control input DN for selectively providing a current I2 passing through two terminals N21 and N22 of the controllable current generating circuit 104. The proposed charge pump circuit 100 may be employed by a phase-locked loop (PLL) circuit. For example, the PLL circuit may include a phase-frequency detector (PFD) circuit, the charge pump circuit 100 shown in FIG. 1, a loop filter 10 shown in FIG. 1, a controllable oscillator circuit (e.g., a voltage-controlled oscillator 20 shown in FIG. 1), and a feedback circuit (e.g., a frequency divider). The PFD circuit (not shown) is arranged to generate an error output by comparing a reference clock signal with a feedback clock signal, where the feedback clock signal is provided by the feedback circuit (not shown) which applies frequency division to an output clock signal CLK_OUT of the voltage-controlled oscillator (VCO) 20, where the error output of the PFD circuit includes control inputs UP and DN of controllable clock generating circuits 102 and 104. The charge pump circuit 100 is arranged to generate a charge pump output I_CP according to the error output {UP, DN} of the PFD circuit, where the charge pump output I_CP may be a charging current or a discharging current, depending upon the error output {UP, DN}. The output terminal N_OUT is coupled to the loop filter 10. For example, the loop filter 10 may include a resistor $R_Z$ and two capacitors $C_Z$ and $C_P$. Hence, the control voltage $V_{CTRL}$ at the output terminal N_OUT is adjusted by the charge pump output I_CP flowing into or drained from the loop filter 10. The voltage-controlled oscillator 20 is arranged to generate the output clock signal CK_OUT according to the control voltage $V_{CTRL}$, where the magnitude of the control voltage $V_{CTRL}$ decides a frequency of the output clock signal CK_OUT.

As shown in FIG. 1, the controllable current generating circuit 102 is coupled between a power rail VDD and the capacitor 106, and the capacitor 106 is coupled between the controllable current generating circuit 102 and a power rail VSS, where the power rail VDD is used to deliver a supply voltage (e.g., +3.3V), and the power rail VSS is used to deliver a ground voltage (e.g., 0V). More specifically, the terminal N12 of the controllable current generating circuit 102 is coupled to the power rail VDD, the terminal N11 of the controllable current generating circuit 102 is coupled to one plate N31 of the capacitor 106, and another plate N32 of the capacitor 106 is coupled to the power rail VSS. In addition, the controllable current generating circuit 104 is coupled between the power rail VDD and the capacitor 108. More specifically, the terminal N22 of the controllable current generating circuit 104 is coupled to the power rail VDD, and the terminal N21 of the controllable current generating circuit 104 is coupled to one plate N41 of the capacitor 108.

Figure 2:
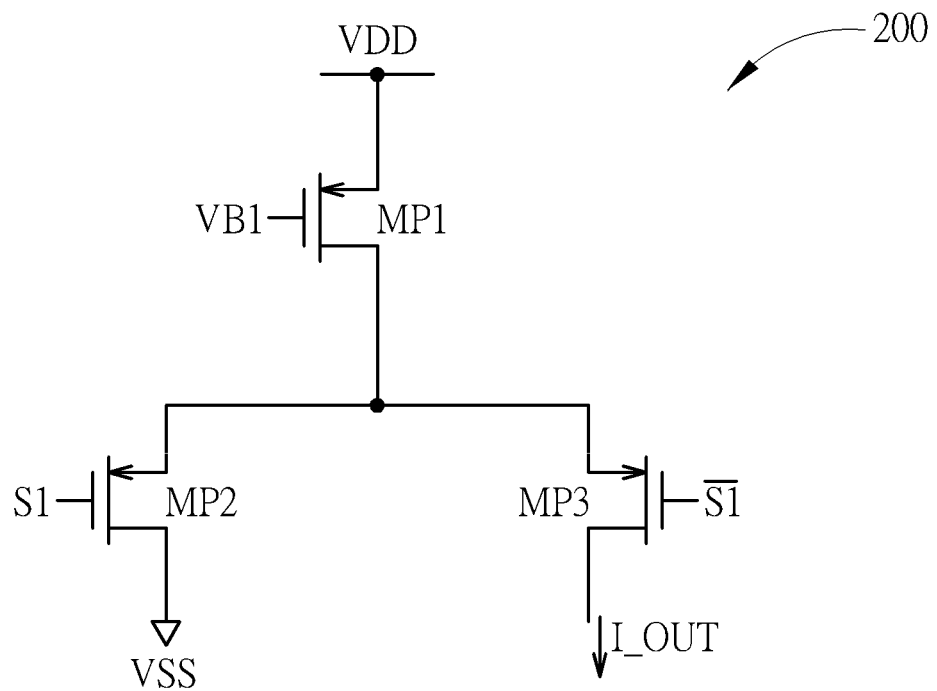
FIG. 2 is a diagram illustrating a first exemplary circuit design of a controllable current generating circuit according to an embodiment of the present invention.

In this embodiment, each of the controllable current generating circuits 102 and 104 is implemented by using P-channel metal-oxide-semiconductor field-effect transistors (PMOS transistors) only. FIG. 2 is a diagram illustrating a first exemplary circuit design of a controllable current generating circuit according to an embodiment of the present invention. The controllable current generating circuit 200 includes a plurality of PMOS transistors MP1, MP2, and MP3. A source terminal of the PMOS transistor MP1 is coupled to a power rail VDD, a gate terminal of the PMOS transistor MP1 is arranged to receive a predetermined bias voltage VB1, and a drain terminal of the PMOS transistor MP1 is coupled to source terminals of PMOS transistors MP2 and MP3, where the power rail VDD is used to deliver a supply voltage (e.g., +3.3V). The PMOS transistor MP1 is configured to operate in a saturation mode for acting as a current source. The controllable current generating circuit 200 has an output path and a bypass path. The bypass path is implemented with the PMOS transistor MP2 having a gate terminal arranged to receive a control input S1 and a drain terminal coupled to a power rail VSS, where the power rail VSS is used to deliver a ground voltage (e.g., 0V). The output path is implemented with the PMOS transistor MP3 having a gate terminal arranged to receive an inverted control input $\overline{S1}$ (which is an inverted version of the control input S1) and a drain terminal arranged to output a current I_OUT generated from the current source (i.e., PMOS transistor MP1).

When the controllable current generating circuit 102 shown in FIG. 1 is implemented by the controllable current generating circuit 200 shown in FIG. 2, the control input S1 is set by the control input UP, the inverted control input $\overline{S1}$ is set by an inverted version of the control input UP, and the current I_OUT is the current I1 provided to the capacitor 106. When the control input UP is asserted by the PFD circuit to have a high logic level, the PMOS transistor MP3 is turned on for passing the current I_OUT (I1=I_OUT) to the capacitor 106, and the PMOS transistor MP2 is turned off. When the control input UP is deasserted by the PFD circuit to have a logic low level, the PMOS transistor MP3 is turned off, and the PMOS transistor MP2 is turned on for bypassing the current I_OUT to the power rail VSS. The PMOS transistor MP3 acts as a switch circuit coupled between the current source (i.e., PMOS transistor MP1) and the capacitor 106. When the PMOS transistor MP3 is turned off, the current source (i.e., PMOS transistor MP1) is disconnected from the capacitor 106.

When the controllable current generating circuit 104 shown in FIG. 1 is implemented by the controllable current generating circuit 200 shown in FIG. 2, the control input S1 is set by the control input DN, the inverted control input $\overline{S1}$ is set by an inverted version of the control input DN, and the current I_OUT is the current I2 provided to the capacitor 108. When the control input DN is asserted by the PFD circuit to have a high logic level, the PMOS transistor MP3 is turned on for passing the current I_OUT (I2=I_OUT) to the capacitor 108, and the PMOS transistor MP2 is turned off. When the control input DN is deasserted by the PFD circuit to have a logic low level, the PMOS transistor MP3 is turned off, and the PMOS transistor MP2 is turned on for bypassing the current I_OUT to the power rail VSS. The PMOS transistor MP3 acts as a switch circuit coupled between the current source (i.e., PMOS transistor MP1) and the capacitor 108. When the PMOS transistor MP3 is turned off, the current source (i.e., PMOS transistor MP1) is disconnected from the capacitor 108.

In this embodiment, a capacitor swapping technique is implemented in the charge pump circuit 100. For example, capacitor swapping can be achieved through the interconnection circuit 110. As shown in FIG. 1, the interconnection circuit 110 includes a plurality of switch circuits SW1, SW2, SW3, and SW4. The on/off state of the switch circuit SW3 is determined by one switch control signal ϕ1, and the on/off state of each of switch circuits SW1, SW2, and SW4 is determined by another switch control signal ϕ2. The switch control signals ϕ1 and ϕ2 are properly set to ensure that switch circuits SW1, SW2, and SW4 are switched on while switch circuit SW3 is switched off and switch circuit SW3 is switched on while switch circuits SW1, SW2, and SW4 are switched off.

Figure 3:
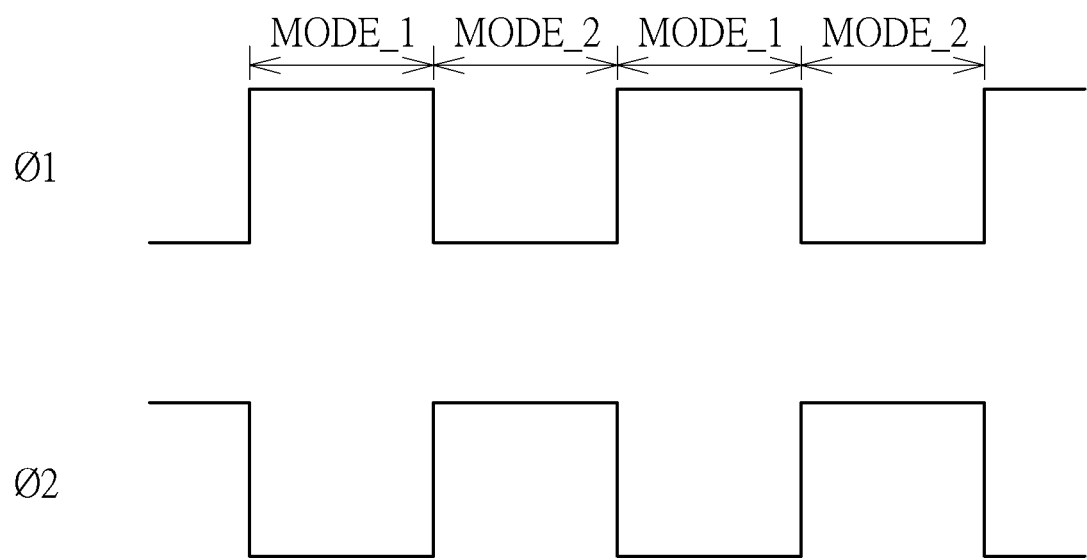
FIG. 3 is a diagram illustrating waveforms of switch control signals according to an embodiment of the present invention.

FIG. 3 is a diagram illustrating waveforms of switch control signals ϕ1 and ϕ2 according to an embodiment of the present invention. In this embodiment, the charge pump circuit 100 enters a first mode MODE_1 and a second mode MODE_2, alternatingly. The switch circuit SW3 is switched on during the first mode MODE_1 of the charge pump circuit 100, and is switch off during the second mode MODE_2 of the charge pump circuit 100. The switch circuits SW1, SW2, and SW4 are switched off during the first mode MODE_1 of the charge pump circuit 100, and are switched on during the second mode MODE_2 of the charge pump circuit 100. It should be noted that a period in which the charge pump circuit 100 operates in the first mode MODE_1 does not overlap a period in which the charge pump circuit 100 operates in the second mode MODE_2. Hence, the switch circuits SW1-SW4 are not switched on at the same time.

Figure 4:
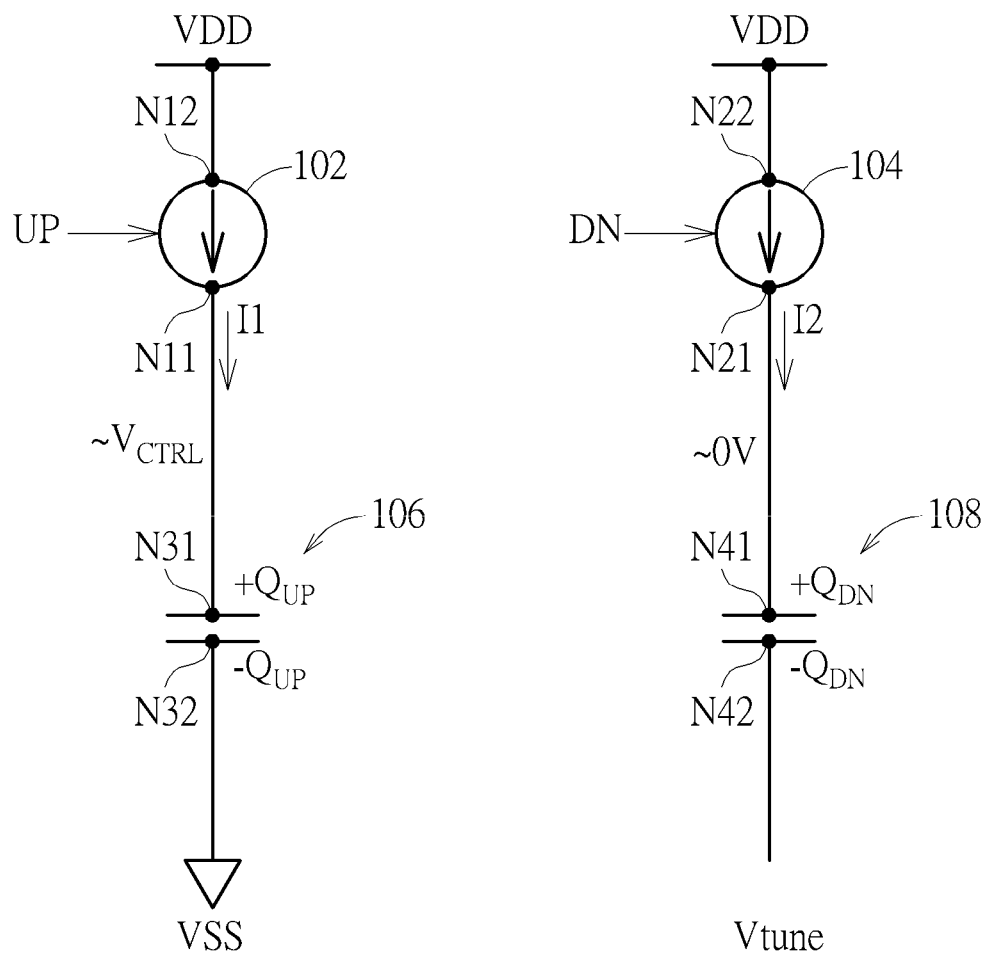
FIG. 4 is a diagram illustrating an equivalent circuit of the first charge pump circuit operating in a first mode according to an embodiment of the present invention.

FIG. 4 is a diagram illustrating an equivalent circuit of the charge pump circuit 100 operating in the first mode MODE_1 according to an embodiment of the present invention. During the first mode MODE_1 of the charge pump circuit 100, the interconnection circuit 110 disconnects the plate N31 of the capacitor 106 from the output terminal N_OUT, disconnects the plate N42 of the capacitor 108 from the output terminal N_OUT, disconnects the plate N41 of the capacitor 108 from the power rail VSS, and connects the plate N42 of the capacitor 108 to an alternating current (AC) ground point. In practice, any voltage output with a stable direct current (DC) voltage can be selected as the AC ground point. For example, the AC ground point may be a supply voltage delivered by the power rail VDD or a ground voltage delivered by the power rail VSS. For another example, the AC ground point may be a voltage output that is not delivered by any of the power rails VDD and VSS. In this embodiment, the buffer circuit 112 is arranged to generate the voltage output Vtune according to the control voltage $V_{CTRL}$ at the output terminal N_OUT. The buffer circuit 112 may be a unity-gain buffer (also called a unity-gain amplifier) that is implemented by an operational amplifier with a voltage gain of 1. During the first mode MODE_1 of the charge pump circuit 100, the control voltage $V_{CTRL}$ is held by the loop filter 10 due to the fact that the output terminal N_OUT is floated by the switched-off switch circuits SW1 and SW2, and the voltage output Vtune has a stable DC voltage that is set by the buffer circuit 112 (i.e., Vtune=$V_{CTRL}$).

During a period in which the charge pump circuit 100 operates in the first mode MODE_1, the control input UP is asserted and then deasserted, and the control input DN is asserted and then deasserted. During an active period T1 in which the control input UP is asserted, the controllable current generating circuit 102 provides the current I1 to the capacitor 106, where the plate N31 has a positive polarity (+), and the plate N32 has a negative polarity (−). At an end of the active period T1, electrical charge $Q_{UP}$ (units in Coulombs) is stored by the capacitor 106, where $Q_{UP}$=I1*T1. During an active period T2 in which the control input DN is asserted, the controllable current generating circuit 104 provides the current I2 to the capacitor 108, where the plate N41 has a positive polarity (+), and the plate N42 has a negative polarity (−). At an end of the active period T2, electrical charge $Q_{DN}$ (units in Coulombs) is stored by the capacitor 108, where $Q_{DN}$=I2*T2.

In a case where the charge pump circuit 100 is employed by a PLL circuit, the control input UP generated from a PFD circuit is intended to manage electrical charge supplied to the output terminal N_OUT, and the control input DN generated from the PFD circuit is intended to manage electrical charge drained from the output terminal N_OUT. As shown in FIG. 4, the controllable current generating circuit 102 is used to charge the capacitor 106, and the controllable current generating circuit 104 is used to charge the capacitor 108. To achieve the needed charge subtraction, a capacitor swapping technique is implemented in the charge pump circuit 100.

Figure 5:
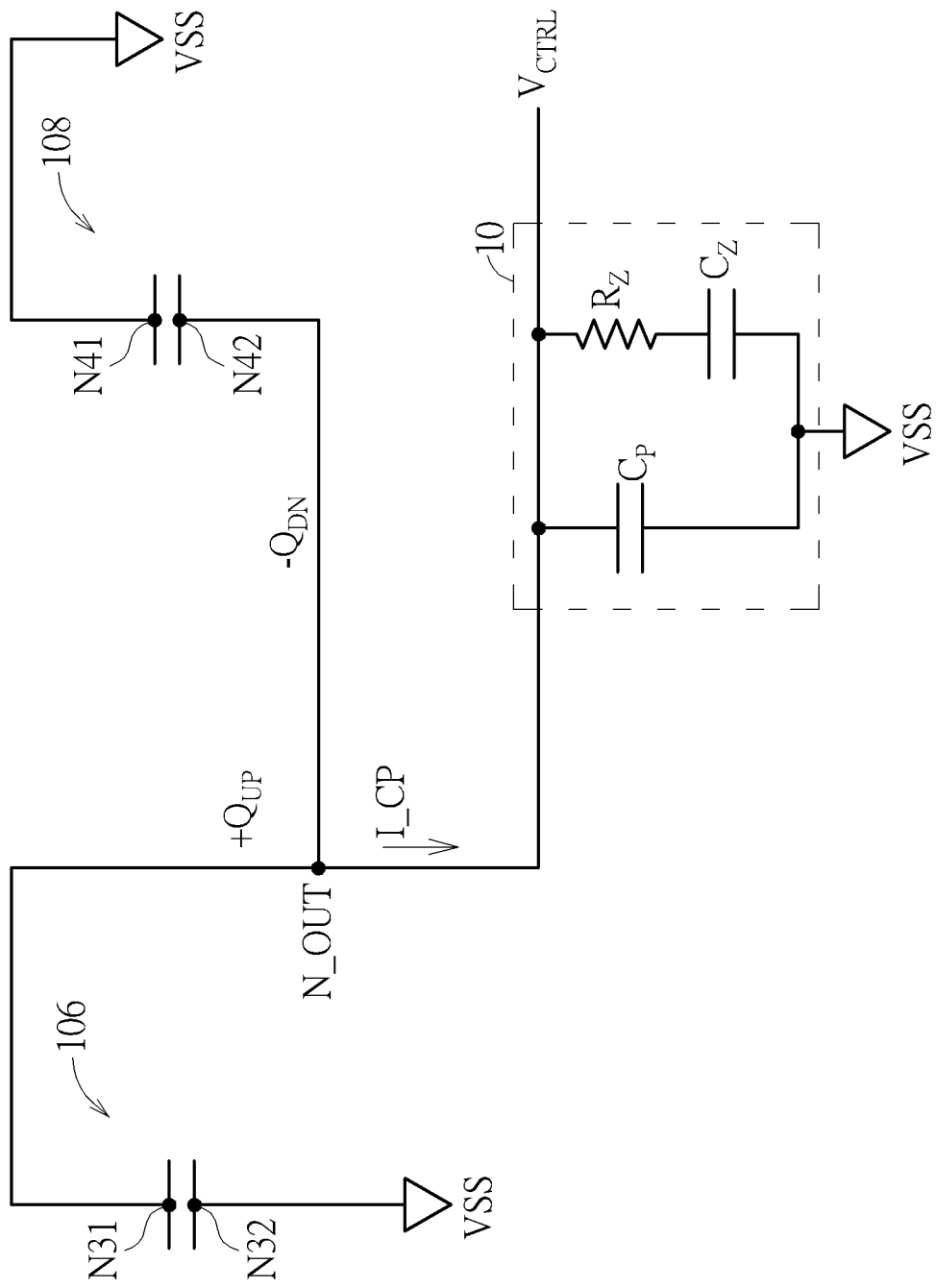
FIG. 5 is a diagram illustrating an equivalent circuit of the first charge pump circuit operating in a second mode according to an embodiment of the present invention.

FIG. 5 is a diagram illustrating an equivalent circuit of the charge pump circuit 100 operating in the second mode MODE_2 according to an embodiment of the present invention. During the second mode MODE_2 of the charge pump circuit 100, the interconnection circuit 110 connects the plate N31 of the capacitor 106 to the output terminal N_OUT, connects the plate N42 of the capacitor 108 to the output terminal N_OUT, connects the plate N41 of the capacitor 108 to the power rail VSS, and disconnects the plate N42 of the capacitor 108 from the AC ground point (e.g., voltage output Vtune of buffer circuit 112).

During a period in which the charge pump circuit 100 operates in the second mode MODE_2, both of the control inputs UP and DN remain deasserted. Since the plate N41 of the capacitor 108 is coupled to the power rail VSS and the plate N42 of the capacitor 108 is coupled to the plate N31 of the capacitor 106, charge sharing is performed for subtracting the electrical charge $Q_{DN}$ stored in the capacitor 108 from the electrical charge $Q_{UP}$ stored in the capacitor 106, thus resulting in the charge pump output I_CP. For example, the charge pump output I_CP may be a charging current for pulling up the control voltage $V_{CTRL}$ when ($Q_{UP}-Q_{DN}$) is positive, and may be a discharging current for pulling down the control voltage $V_{CTRL}$ when ($Q_{UP}-Q_{DN}$) is negative.

Certain features of the proposed charge pump (CP) circuit 100 are listed in the following table.

TABLE 1

| | |
|---|---|
| CP noise | Good |
| Trade-off between operation range and noise performance | Yes |
| VDD noise | Don't care |
| Varactor density | Poor |

As shown in FIG. 5, the plate N41 of the capacitor 108 is coupled to a ground voltage (e.g., 0V) provided by the power rail VSS. Hence, after the charge pump circuit 100 leaves the second mode MODE_2 and then enters the first mode MODE_1 again, the controllable current generating circuit 104 (which is implemented by using PMOS transistors only) is coupled between the supply voltage (e.g., +3.3V) and the ground voltage (e.g., 0V) at the time the controllable current generating circuit 104 is enabled by the asserted control input DN. Since a large overdrive voltage is possessed by a PMOS transistor that is biased in a saturation mode to act as a current source, the noise resulting from the current source of the controllable current generating circuit 104 is reduced. In this way, the noise performance of the proposed charge pump circuit 100 is good.

As shown in FIG. 5, the plate N31 of the capacitor 106 is coupled to the control voltage $V_{CTRL}$. Hence, after the charge pump circuit 100 leaves the second mode MODE_2 and then enters the first mode MODE_1 again, the controllable current generating circuit 102 (which is implemented by using PMOS transistors only) is coupled between the supply voltage (e.g., +3.3V) and the control voltage $V_{CTRL}$ ($V_{CTRL}$=Vtune) at the time the controllable current generating circuit 102 is enabled by the asserted control input UP. Since an overdrive voltage possessed by a PMOS transistor that is biased in a saturation mode to act as a current source is dependent on the control voltage $V_{CTRL}$ ($V_{CTRL}$=Vtune) there is a trade-off between operation range of the control voltage $V_{CTRL}$ and noise performance of the controllable current generating circuit 102.

As shown in FIG. 5, the plate N31 of the capacitor 106 is coupled to the control voltage $V_{CTRL}$, while the plate N32 of the capacitor 106 is coupled to the ground voltage (e.g., 0V) provided by the power rail VSS; and the plate N42 of the capacitor 108 is coupled to the control voltage $V_{CTRL}$, while the plate N41 of the capacitor 108 is coupled to the ground voltage (e.g., 0V) provided by the power rail VSS. Since none of the plates N31 and N41 is coupled to the supply voltage (e.g., +3.3V) provided by the power rail VDD at the time the plates N31 and N42 are coupled to the control voltage $V_{CTRL}$, the control voltage $V_{CTRL}$ adjusted by the charge pump circuit 100 and provided to the voltage-controlled oscillator 20 is immune to noise of the supply voltage during the second mode MODE_2 of the charge pump circuit 100.

As shown in FIG. 4, after the charge pump circuit 100 leaves the second mode MODE_2 and then enters the first mode MODE_1 again, the controllable current generating circuit 102 (which is implemented by using PMOS transistors only) is coupled between the supply voltage (e.g., +3.3V) and the control voltage $V_{CTRL}$ ($V_{CTRL}$=Vtune) at the time the controllable current generating circuit 102 is enabled by the asserted control input UP. To reduce the noise resulting from a PMOS transistor that is biased in a saturation mode to act as a current source, the control voltage $V_{CTRL}$ is required to be as low as possible for increasing an overdrive voltage of the PMOS transistor that acts as the current source. For example, the VCO 20 may be configured to have a large VCO gain $K_{VCO}$, thereby allowing the PLL circuit to enter a frequency locked state under a low control voltage $V_{CTRL}$. The capacitors $C_P$ and $C_Z$ of the loop filter 10 may be implemented by varactors. Since the control voltage $V_{CTRL}$ is preferably low for improving the noise performance of the controllable current generating circuit 102, the capacitance density (capacitance per unit area) of the varactor may be poor.

Figure 6:
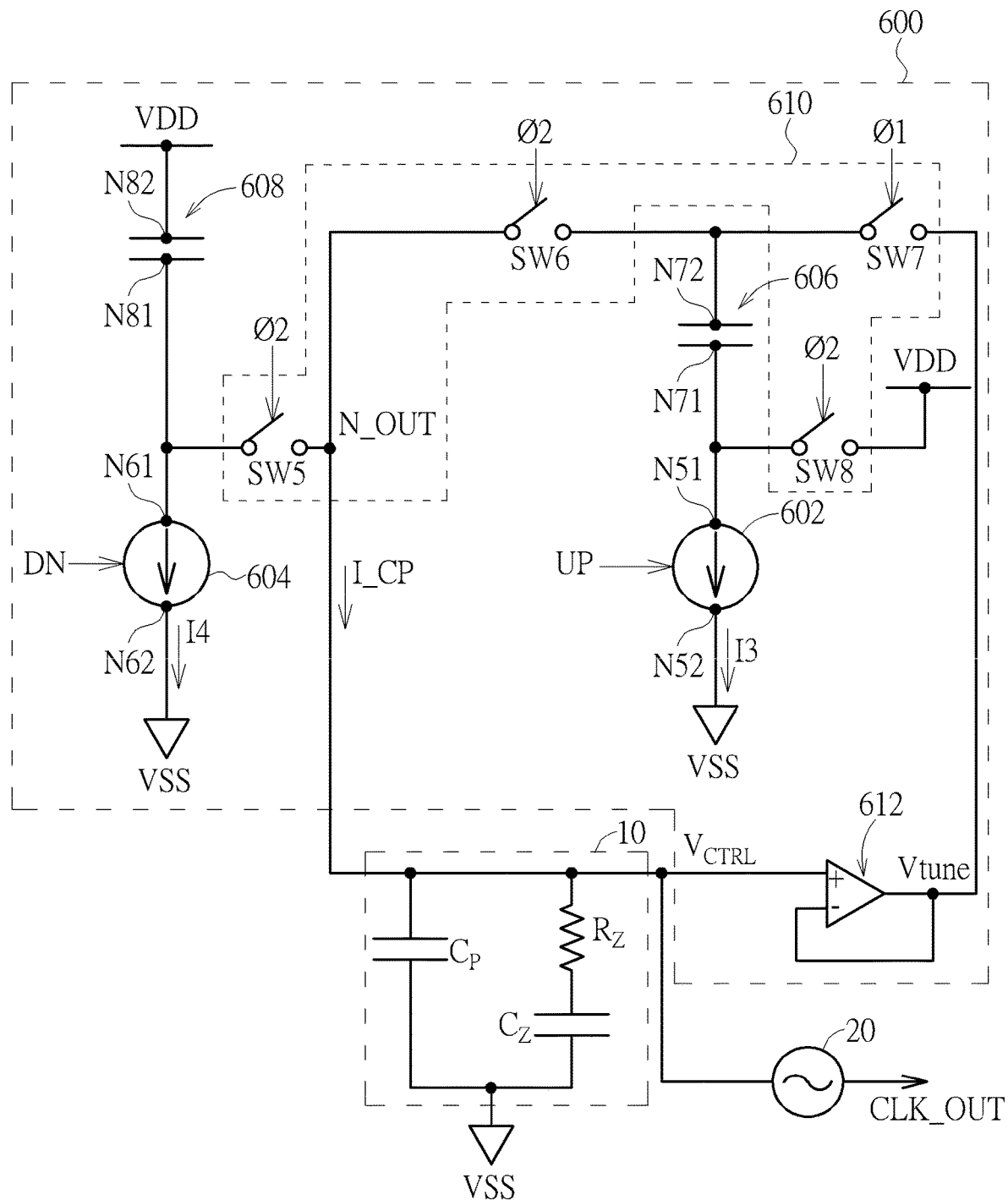
FIG. 6 is a diagram illustrating a second charge pump circuit according to an embodiment of the present invention.

FIG. 6 is a diagram illustrating a second charge pump circuit according to an embodiment of the present invention. The charge pump circuit 600 includes a plurality of controllable current generating circuits 602, 604, a plurality of capacitors 606, 608, an interconnection circuit 610, and an optional buffer circuit 612. The charge pump circuit 600 is used for adjusting a control voltage $V_{CTRL}$ at an output terminal N_OUT of the charge pump circuit 600. The controllable current generating circuit 602 is arranged to refer to a control input UP for selectively providing a current I3 passing through two terminals N51 and N52 of the controllable current generating circuit 602. The controllable current generating circuit 604 is arranged to refer to a control input DN for selectively providing a current I4 passing through two terminals N61 and N62 of the controllable current generating circuit 604. The proposed charge pump circuit 600 may be employed by a PLL circuit. For example, the PLL circuit may include a PFD circuit, the charge pump circuit 600 shown in FIG. 6, the loop filter 10 shown in FIG. 6, a controllable oscillator circuit (e.g., the voltage-controlled oscillator 20 shown in FIG. 6), and a feedback circuit (e.g., a frequency divider). The PFD circuit (not shown) is arranged to generate an error output by comparing a reference clock signal with a feedback clock signal, where the feedback clock signal is provided by the feedback circuit (not shown) which applies frequency division to the output clock signal CLK_OUT of the voltage-controlled oscillator 20, where the error output of the PFD circuit includes control inputs UP and DN of controllable current generating circuits 602 and 604. The charge pump circuit 600 is arranged to generate a charge pump output I_CP according to the error output {UP, DN} of the PFD circuit, where the charge pump output I_CP may be a charging current or a discharging current, depending upon the error output {UP, DN}. The output terminal N_OUT is coupled to the loop filter 10. Hence, the control voltage $V_{CTRL}$ at the output terminal N_OUT of the charge pump circuit 600 is adjusted by the charge pump output I_CP flowing into or drained from the loop filter 10. The voltage-controlled oscillator 20 is arranged to generate the output clock signal CK_OUT according to the control voltage $V_{CTRL}$, where the magnitude of the control voltage $V_{CTRL}$ decides a frequency of the output clock signal CK_OUT.

As shown in FIG. 6, the controllable current generating circuit 604 is coupled between a power rail VSS and the capacitor 608, and the capacitor 608 is coupled between the controllable current generating circuit 604 and a power rail VDD, where the power rail VDD is used to deliver a supply voltage (e.g., +3.3V), and the power rail VSS is used to deliver a ground voltage (e.g., 0V). More specifically, the terminal N62 of the controllable current generating circuit 604 is coupled to the power rail VSS, the terminal N61 of the controllable current generating circuit 604 is coupled to one plate N81 of the capacitor 608, and another plate N82 of the capacitor 608 is coupled to the power rail VDD. In addition, the controllable current generating circuit 602 is coupled between the power rail VSS and the capacitor 606. More specifically, the terminal N52 of the controllable current generating circuit 602 is coupled to the power rail VSS, and the terminal N51 of the controllable current generating circuit 602 is coupled to one plate N71 of the capacitor 606.

Figure 7:
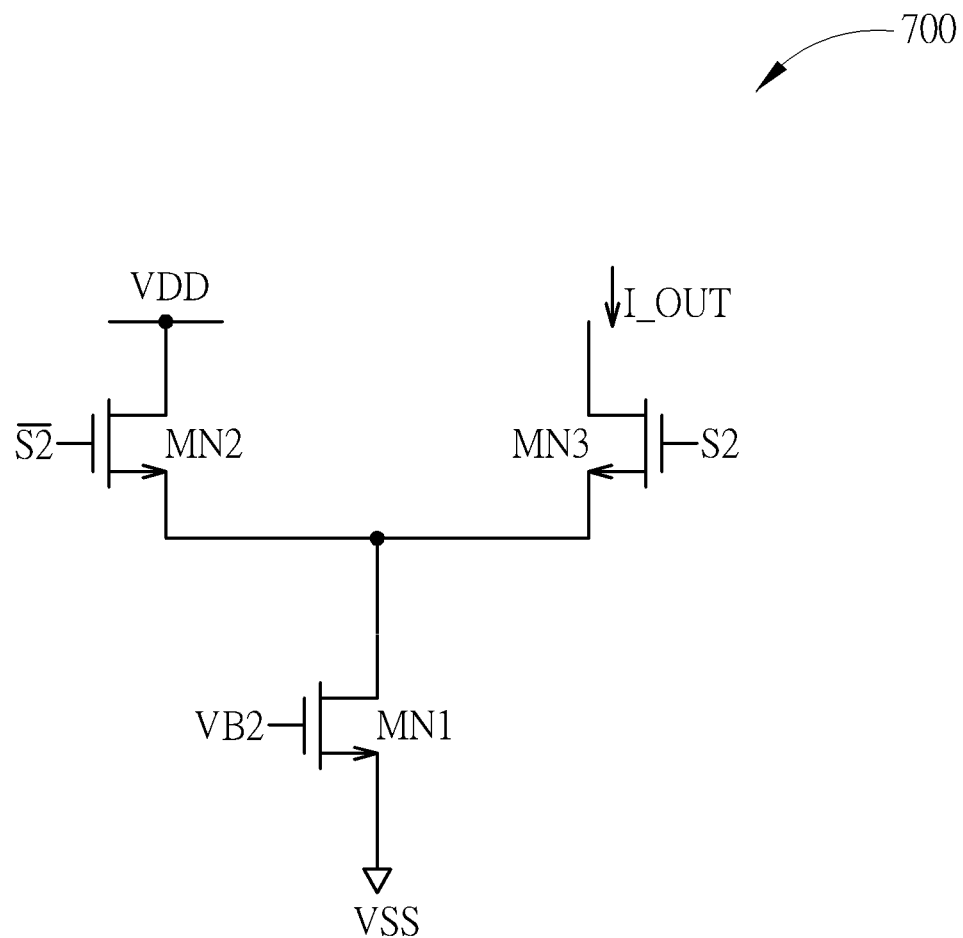
FIG. 7 is a diagram illustrating a second exemplary circuit design of a controllable current generating circuit according to an embodiment of the present invention.

In this embodiment, each of the controllable current generating circuits 602 and 604 is implemented by using N-channel metal-oxide-semiconductor field-effect transistors (NMOS transistors) only. FIG. 7 is a diagram illustrating a second exemplary circuit design of a controllable current generating circuit according to an embodiment of the present invention. The controllable current generating circuit 700 includes a plurality of NMOS transistors MN1, MN2, and MN3. A source terminal of the NMOS transistor MN1 is coupled to a power rail VSS, a gate terminal of the NMOS transistor MN1 is arranged to receive a predetermined bias voltage VB2, and a drain terminal of the NMOS transistor MN1 is coupled to source terminals of the NMOS transistors MN2 and MN3, where the power rail VSS is used to deliver a ground voltage (e.g., 0V). The NMOS transistor MN1 is configured to operate in a saturation mode for acting as a current source. The controllable current generating circuit 700 has an output path and a bypass path. The bypass path is implemented with the NMOS transistor MN2 having a gate terminal arranged to receive a control input $\overline{S2}$ (which is an inverted version of a control input S2) and a drain terminal coupled to a power rail VDD, where the power rail VDD is used to deliver a supply voltage (e.g., +3.3V). The output path is implemented with the NMOS transistor MN3 having a gate terminal arranged to receive the control input S2 and a drain terminal arranged to drain a current I_OUT set by the current source (i.e., NMOS transistor MN1).

When the controllable current generating circuit 602 shown in FIG. 6 is implemented by the controllable current generating circuit 700 shown in FIG. 7, the control input S2 is set by the control input UP, the inverted control input $\overline{S2}$ is set by an inverted version of the control input UP, and the current I_OUT is the current I3 drained from the capacitor 606. When the control input UP is asserted by the PFD circuit to have a high logic level, the NMOS transistor MN3 is turned on for draining the current I_OUT (I3=I_OUT) from the capacitor 606, and the NMOS transistor MN2 is turned off. When the control input UP is deasserted by the PFD circuit to have a logic low level, the NMOS transistor MN3 is turned off, and the NMOS transistor MN2 is turned on for bypassing the current I_OUT drained from the power rail VDD. The NMOS transistor MN3 acts as a switch circuit coupled between the current source (i.e., NMOS transistor MN1) and the capacitor 606. When the NMOS transistor MN3 is turned off, the current source (i.e., NMOS transistor MN1) is disconnected from the capacitor 606.

When the controllable current generating circuit 604 shown in FIG. 6 is implemented by the controllable current generating circuit 700 shown in FIG. 7, the control input S2 is set by the control input DN, the inverted control input $\overline{S2}$ is set by an inverted version of the control input DN, and the current I_OUT is the current I4 drained from the capacitor 608. When the control input DN is asserted by the PFD circuit to have a high logic level, the NMOS transistor MN3 is turned on for draining the current I_OUT (I4=I_OUT) from the capacitor 608, and the NMOS transistor MN2 is turned off. When the control input DN is deasserted by the PFD circuit to have a logic low level, the NMOS transistor MN3 is turned off, and the NMOS transistor MN2 is turned on for bypassing the current I_OUT drained from the power rail VDD. The NMOS transistor MN3 acts as a switch circuit coupled between the current source (i.e., NMOS transistor MN1) and the capacitor 608. When the NMOS transistor MN3 is turned off, the current source (i.e., NMOS transistor MN1) is disconnected from the capacitor 608.

In this embodiment, a capacitor swapping technique is implemented in the charge pump circuit 600. For example, capacitor swapping can be achieved through the interconnection circuit 610. As shown in FIG. 6, the interconnection circuit 610 includes a plurality of switch circuits SW5, SW6, SW7, and SW8. The on/off state of the switch circuit SW7 is determined by one switch control signal φ1, and the on/off state of each of switch circuits SW5, SW6, and SW8 is determined another switch control signal φ2. The switch control signals φ1 and φ2 are properly set to ensure that switch circuits SW5, SW6, and SW8 are switched on while switch circuit SW7 is switched off and switch circuit SW7 is switched on while switch circuits SW5, SW6, and SW8 are switched off.

In this embodiment, the charge pump circuit 600 enters a first mode MODE_1 and a second mode MODE_2, alternatingly. For example, the switch control signals φ1 and φ2 may have the waveforms shown in FIG. 3. Hence, the switch circuits SW5, SW6, and SW8 are switched off during the first mode MODE_1 of the charge pump circuit 600, and are switched on during the second mode MODE_2 of the charge pump circuit 600. In addition, the switch circuit SW7 is switched on during the first mode MODE_1 of the charge pump circuit 600, and is switch off during the second mode MODE_2 of the charge pump circuit 600. It should be noted that a period in which the charge pump circuit 600 operates in the first mode MODE_1 does not overlap a period in which the charge pump circuit 600 operates in the second mode MODE_2. Hence, the switch circuits SW5-SW8 are not switched on at the same time.

Figure 8:
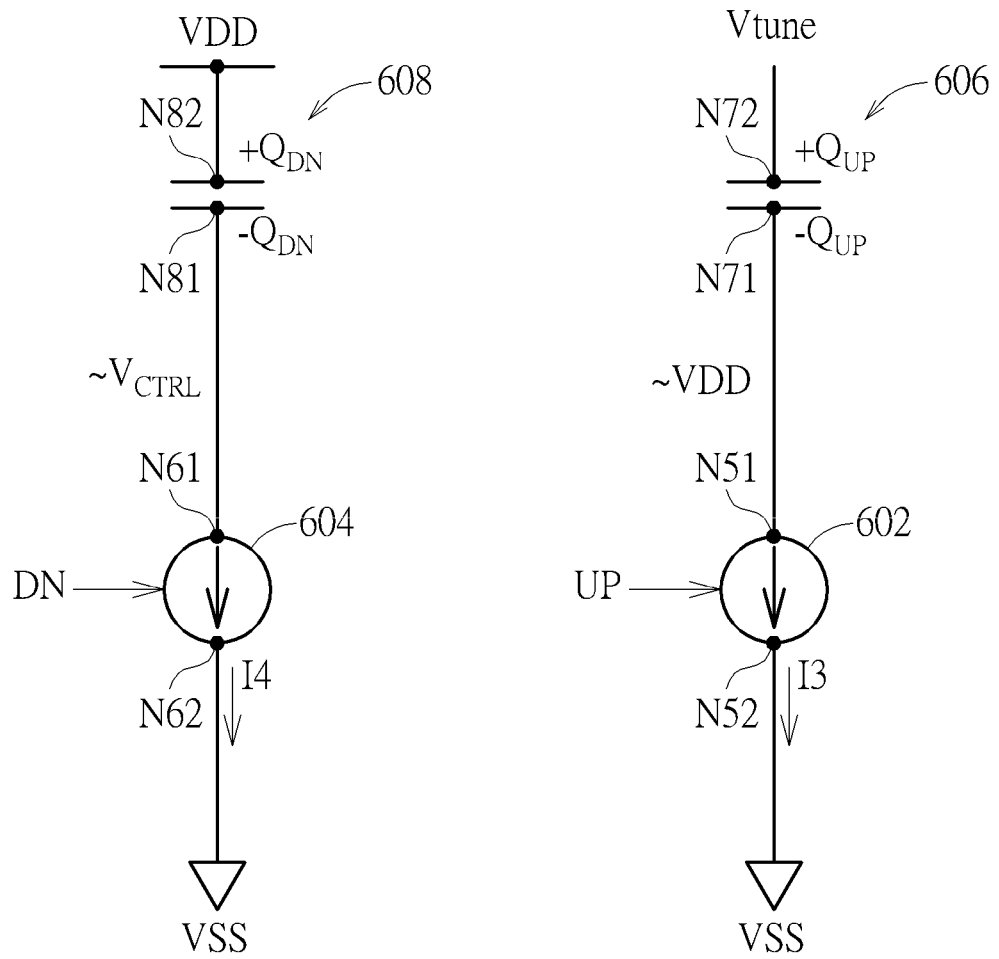
FIG. 8 is a diagram illustrating an equivalent circuit of the second charge pump circuit operating in a first mode according to an embodiment of the present invention.

FIG. 8 is a diagram illustrating an equivalent circuit of the charge pump circuit 600 operating in the first mode MODE_1 according to an embodiment of the present invention. During the first mode MODE_1 of the charge pump circuit 600, the interconnection circuit 610 disconnects the plate N81 of the capacitor 608 from the output terminal N_OUT, disconnects the plate N72 of the capacitor 606 from the output terminal N_OUT, disconnects the plate N71 of the capacitor 606 from the power rail VDD, and connects the plate N72 of the capacitor 606 to an AC ground point. In practice, any voltage output with a stable DC voltage can be selected as the AC ground point. For example, the AC ground point may be a supply voltage delivered by the power rail VDD or a ground voltage delivered by the power rail VSS. For another example, the AC ground point may be a voltage output that is not delivered by any of the power rails VDD and VSS. In this embodiment, the buffer circuit 612 is arranged to generate the voltage output Vtune according to the control voltage $V_{CTRL}$ at the output terminal N_OUT. The buffer circuit 612 may be a unity-gain buffer (also called a unity-gain amplifier) that is implemented by an operational amplifier with a voltage gain of 1. During the first mode MODE_1 of the charge pump circuit 600, the control voltage $V_{CTRL}$ is held by the loop filter 10 due to the fact that the output terminal N_OUT is floated by the switched-off switch circuits SW5 and SW6, and the voltage output Vtune has a stable DC voltage that is set by the buffer circuit 612 (i.e., Vtune=$V_{CTRL}$).

During a period in which the charge pump circuit 600 operates in the first mode MODE_1, the control input UP is asserted and then deasserted, and the control input DN is asserted and then deasserted. During an active period T3 in which the control input UP is asserted, the controllable current generating circuit 602 drains the current I3 from the capacitor 606, where the plate N72 has a positive polarity (+), and the plate N71 has a negative polarity (−). At an end of the active period T3, electrical charge $Q_{UP}$ (units in Coulombs) is stored by the capacitor 606, where $Q_{UP}$=I3*T3. During an active period T4 in which the control input DN is asserted, the controllable current generating circuit 604 drains the current I4 from the capacitor 608, where the plate N82 has a positive polarity (+), and the plate N81 has a negative polarity (−). At an end of the active period T4, electrical charge $Q_{DN}$ (units in Coulombs) is stored by the capacitor 608, where $Q_{DN}$=I4*T4.

In a case where the charge pump circuit 600 is employed by a PLL circuit, the control input UP generated from a PFD circuit is intended to manage electrical charge supplied to the output terminal N_OUT, and the control input DN generated from the PFD circuit is intended to manage electrical charge drained from the output terminal N_OUT. As shown in FIG. 8, the controllable current generating circuit 602 is used to discharge the capacitor 606, and the controllable current generating circuit 604 is used to discharge the capacitor 608. To achieve the needed charge subtraction, a capacitor swapping technique is implemented in the charge pump circuit 600.

Figure 9:
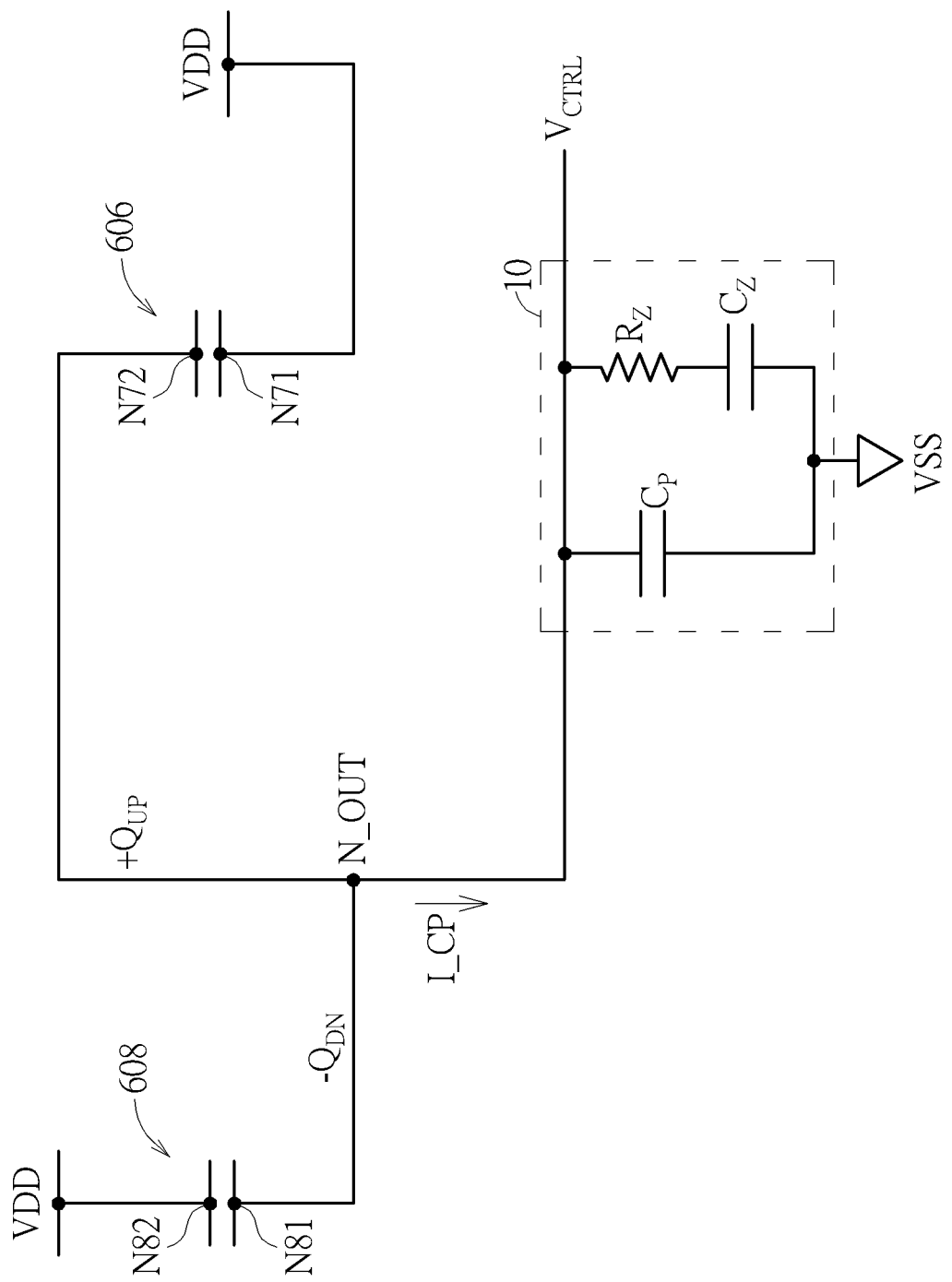
FIG. 9 is a diagram illustrating an equivalent circuit of the second charge pump circuit operating in a second mode according to an embodiment of the present invention.

FIG. 9 is a diagram illustrating an equivalent circuit of the charge pump circuit 600 operating in the second mode MODE_2 according to an embodiment of the present invention. During the second mode MODE_2 of the charge pump circuit 600, the interconnection circuit 610 connects the plate N81 of the capacitor 608 to the output terminal N_OUT, connects the plate N72 of the capacitor 606 to the output terminal N_OUT, connects the plate N71 of the capacitor 606 to the power rail VDD, and disconnects the plate N72 of the capacitor 606 from the AC ground point (e.g., voltage output Vtune of buffer circuit 612).

During a period in which the charge pump circuit 600 operates in the second mode MODE_2, both of the control inputs UP and DN remain deasserted. Since the plate N71 of the capacitor 606 is coupled to the power rail VDD and the plate N72 of the capacitor 606 is coupled to the plate N81 of the capacitor 608, charge sharing is performed for subtracting the electrical charge $Q_{DN}$ stored in the capacitor 608 from the electrical charge $Q_{UP}$ stored in the capacitor 606, thus resulting in the charge pump output I_CP. For example, the charge pump output I_CP may be a charging current for pulling up the control voltage $V_{CTRL}$ when ($Q_{UP}$−$Q_{DN}$) is positive, and may be a discharging current for pulling down the control voltage $V_{CTRL}$ when ($Q_{UP}$−$Q_{DN}$) is negative.

Certain features of the proposed charge pump (CP) circuit 600 are listed in the following table.

TABLE 2

| | |
|---|---|
| CP noise | Good |
| Trade-off between operation range and noise performance | Yes |
| VDD noise | Required better VDD |
| Varactor density | Good |

As shown in FIG. 9, the plate N71 of the capacitor 606 is coupled to a supply voltage (e.g., +3.3V) provided by the power rail VDD. Hence, after the charge pump circuit 600 leaves the second mode MODE_2 and then enters the first mode MODE_1 again, the controllable current generating circuit 602 (which is implemented by using NMOS transistors only) is coupled between the supply voltage (e.g., +3.3V) and the ground voltage (e.g., 0V) at the time the controllable current generating circuit 602 is enabled by the asserted control input UP. Since a large overdrive voltage is possessed by an NMOS transistor that is biased in a saturation mode to act as a current source, the noise resulting from the current source of the controllable current generating circuit 602 is reduced. In this way, the noise performance of the proposed charge pump circuit 600 is good.

As shown in FIG. 9, the plate N81 of the capacitor 608 is coupled to the control voltage $V_{CTRL}$. Hence, after the charge pump circuit 600 leaves the second mode MODE_2 and then enters the first mode MODE_1 again, the controllable current generating circuit 604 (which is implemented by using NMOS transistors only) is coupled between the control voltage $V_{CTRL}$ ($V_{CTRL}$=Vtune) and the ground voltage (e.g., 0V) at the time the controllable current generating circuit 604 is enabled by the asserted control input DN. Since an overdrive voltage possessed by an NMOS transistor that is biased in a saturation mode to act as a current source is dependent on the control voltage $V_{CTRL}$ ($V_{CTRL}$=Vtune), there is a trade-off between operation range of the control voltage $V_{CTRL}$ and noise performance of the controllable current generating circuit 604.

As shown in FIG. 9, the plate N81 of the capacitor 608 is coupled to the control voltage $V_{CTRL}$, while the plate N82 of the capacitor 608 is coupled to the supply voltage (e.g., +3.3V) provided by the power rail VDD; and the plate N72 of the capacitor 606 is coupled to the control voltage $V_{CTRL}$, while the plate N71 of the capacitor 606 is coupled to the supply voltage (e.g., +3.3V) provided by the power rail VDD. Since the plates N71 and N82 are coupled to the supply voltage (e.g., +3.3V) provided by the power rail VDD at the time the plates N72 and N81 are coupled to the control voltage $V_{CTRL}$, the control voltage $V_{CTRL}$ adjusted by the charge pump circuit 600 and provided to the voltage-controlled oscillator 20 is not immune to noise of the supply voltage during the second mode MODE_2 of the charge pump circuit 600. Thus, a low-noise supply voltage provided by the power rail VDD is required to protect the control voltage $V_{CTRL}$ from noise of the supply voltage.

As shown in FIG. 8, after the charge pump circuit 600 leaves the second mode MODE_2 and then enters the first mode MODE_1 again, the controllable current generating circuit 604 (which is implemented by using NMOS transistors only) is coupled between the control voltage $V_{CTRL}$ ($V_{CTRL}$=Vtune) and the ground voltage (e.g., 0V) at the time the controllable current generating circuit 604 is enabled by the control input DN. To reduce the noise resulting from an NMOS transistor that is biased in a saturation mode to act as a current source, the control voltage $V_{CTRL}$ is required to be as high as possible for increasing an overdrive voltage of the NMOS transistor that acts as the current source. For example, the VCO 20 may be configured to have a small VCO gain $K_{VCO}$, thereby allowing the PLL circuit to enter a frequency locked state under a high control voltage $V_{CTRL}$. The capacitors $C_P$ and $C_Z$ of the loop filter 10 may be implemented by varactors. Since the control voltage $V_{CTRL}$ is preferably high for improving the noise performance of the controllable current generating circuit 604, the capacitance density (capacitance per unit area) of the varactor is good.

Figure 10:
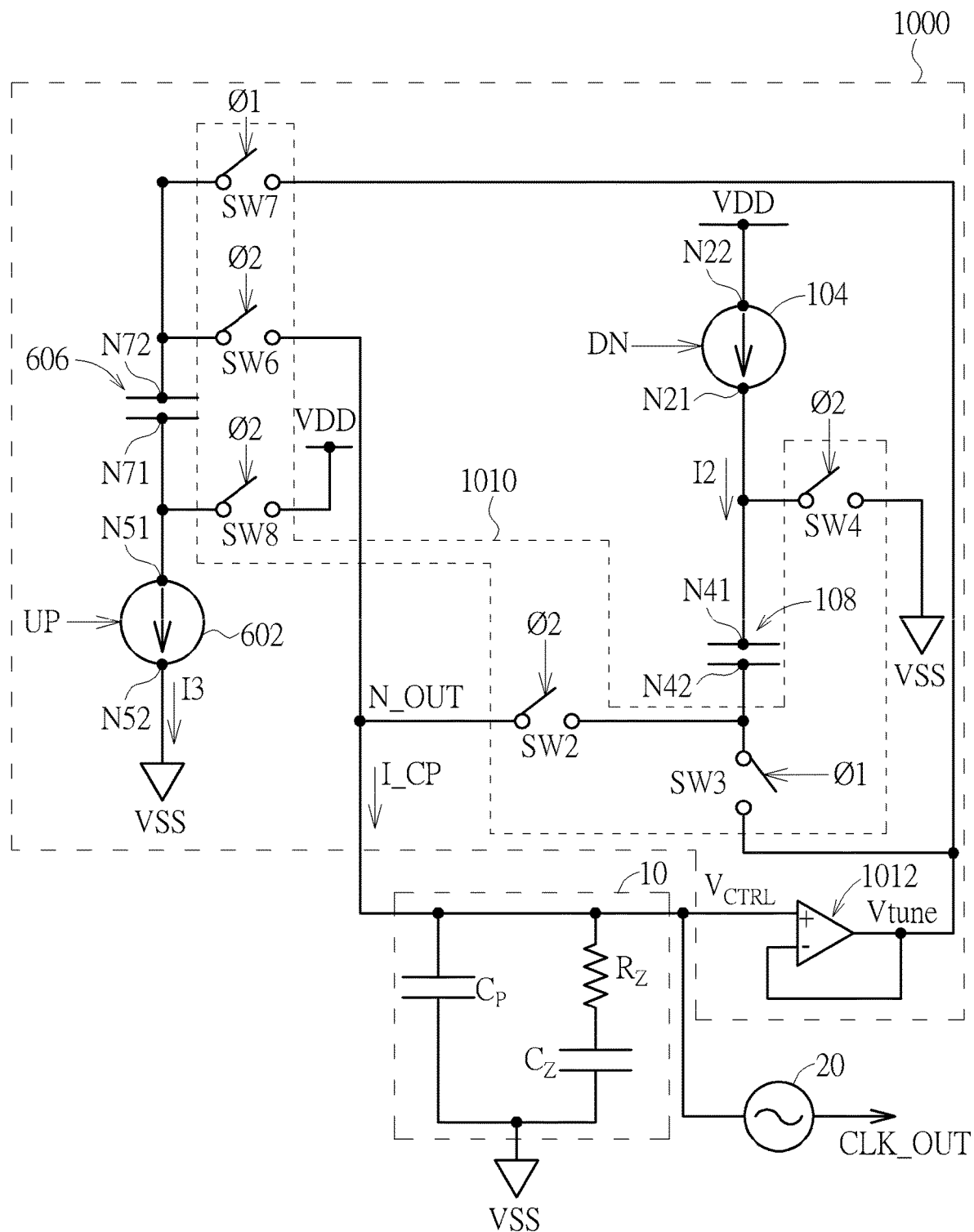
FIG. 10 is a diagram illustrating a third charge pump circuit according to an embodiment of the present invention.

FIG. 10 is a diagram illustrating a third charge pump circuit according to an embodiment of the present invention. The charge pump circuit 1000 is used for adjusting a control voltage $V_{CTRL}$ at an output terminal N_OUT of the charge pump circuit 1000, and has some circuit components that are also included in the aforementioned charge pump circuits 100 and 600. As shown in FIG. 10, the charge pump circuit 1000 includes aforementioned controllable current generating circuits 104, 602, aforementioned capacitors 108, 606, an interconnection circuit 1010, and an optional buffer circuit 1012, where the interconnection circuit 1010 includes aforementioned switch circuits SW2-SW4 and SW6-SW8, and an output terminal of the buffer circuit 1012 is coupled to both of the switch circuits SW3 and SW7.

In this embodiment, the controllable current generating circuit 602 is implemented by using NMOS transistors only, and the controllable current generating circuit 104 is implemented by using PMOS transistors only. For example, the controllable current generating circuit 700 shown in FIG. 7 may be used as the controllable current generating circuit 602 shown in FIG. 10, and the controllable current generating circuit 300 shown in FIG. 3 may be used as the controllable current generating circuit 104 shown in FIG. 10.

Furthermore, a capacitor swapping technique is implemented in the charge pump circuit 1000. For example, capacitor swapping can be achieved through the interconnection circuit 1010, where the on/off state of each of switch circuits SW3 and SW7 is determined by one switch control signal φ1, and the on/off state of each of switch circuits SW2, SW4, SW6, and SW8 is determined by another switch control signal φ2. For example, the switch control signals φ1 and φ2 may have the waveforms shown in FIG. 3, such that the switch circuits SW3 and SW7 are switched on during the first mode Mode_1 of the charge pump circuit 1000 and are switched off during the second mode Mode_2 of the charge pump circuit 1000, and the switch circuits SW2, SW4, SW6, and SW8 are switched off during the first mode Mode_1 of the charge pump circuit 1000 and are switched on during the second mode Mode_2 of the charge pump circuit 1000.

Figure 11:
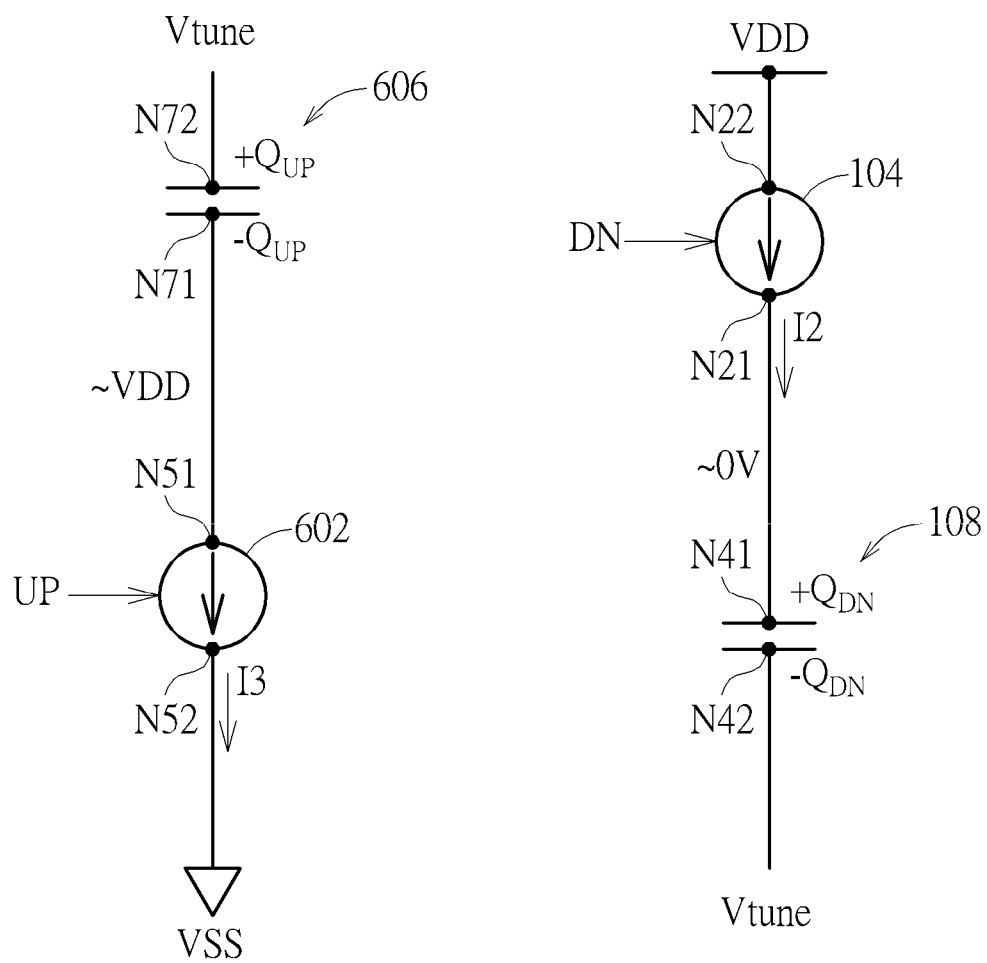
FIG. 11 is a diagram illustrating an equivalent circuit of the third charge pump circuit operating in a first mode according to an embodiment of the present invention.

FIG. 11 is a diagram illustrating an equivalent circuit of the charge pump circuit 1000 operating in the first mode MODE_1 according to an embodiment of the present invention. During the first mode MODE_1 of the charge pump circuit 1000, the interconnection circuit 1010 disconnects the plate N72 of the capacitor 606 from the output terminal N_OUT, disconnects the plate N42 of the capacitor 108 from the output terminal N_OUT, disconnects the plate N71 of the capacitor 606 from the power rail VDD, disconnects the plate N41 of the capacitor 108 from the power rail VSS, and connects the plate N72 of the capacitor 606 and the plate N42 of the capacitor 108 to an AC ground point. In practice, any voltage output with a stable DC voltage can be selected as the AC ground point. For example, the AC ground point may be a supply voltage delivered by the power rail VDD or a ground voltage delivered by the power rail VSS. For another example, the AC ground point may be a voltage output that is not delivered by any of the power rails VDD and VSS. In this embodiment, the buffer circuit 1012 is arranged to generate the voltage output Vtune according to the control voltage $V_{CTRL}$ at the output terminal N_OUT. The buffer circuit 1012 may be a unity-gain buffer (also called a unity-gain amplifier) that is implemented by an operational amplifier with a voltage gain of 1. During the first mode MODE_1 of the charge pump circuit 1000, the control voltage $V_{CTRL}$ is held by the loop filter 10 due to the fact that the output terminal N_OUT is floated by the switched-off switch circuits SW2 and SW6, and the voltage output Vtune has a stable DC voltage that is set by the buffer circuit 1012 (i.e., Vtune=$V_{CTRL}$).

During a period in which the charge pump circuit 1000 operates in the first mode MODE_1, the control input UP is asserted and then deasserted, and the control input DN is asserted and then deasserted. During an active period T3 in which the control input UP is asserted, the controllable current generating circuit 602 drains the current I3 from the capacitor 606, where the plate N72 has a positive polarity (+), and the plate N71 has a negative polarity (−). At an end of the active period T3, electrical charge $Q_{UP}$ (units in Coulombs) is stored by the capacitor 606, where $Q_{UP}$=I3\*T3. During an active period T2 in which the control input DN is asserted, the controllable current generating circuit 104 provides the current I2 to the capacitor 108, where the plate N41 has a positive polarity (+), and the plate N42 has a negative polarity (−). At an end of the active period T2, electrical charge $Q_{DN}$ (units in Coulombs) is stored by the capacitor 108, where $Q_{DN}$=I2\*T2.

In a case where the charge pump circuit 1000 is employed by a PLL circuit, the control input UP generated from a PFD circuit is intended to manage electrical charge supplied to the output terminal N_OUT, and the control input DN generated from the PFD circuit is intended to manage electrical charge drained from the output terminal N_OUT. As shown in FIG. 11, the controllable current generating circuit 602 is used to discharge the capacitor 606, and the controllable current generating circuit 104 is used to charge the capacitor 108. To achieve the needed charge subtraction, a capacitor swapping technique is implemented in the charge pump circuit 1000.

Figure 12:
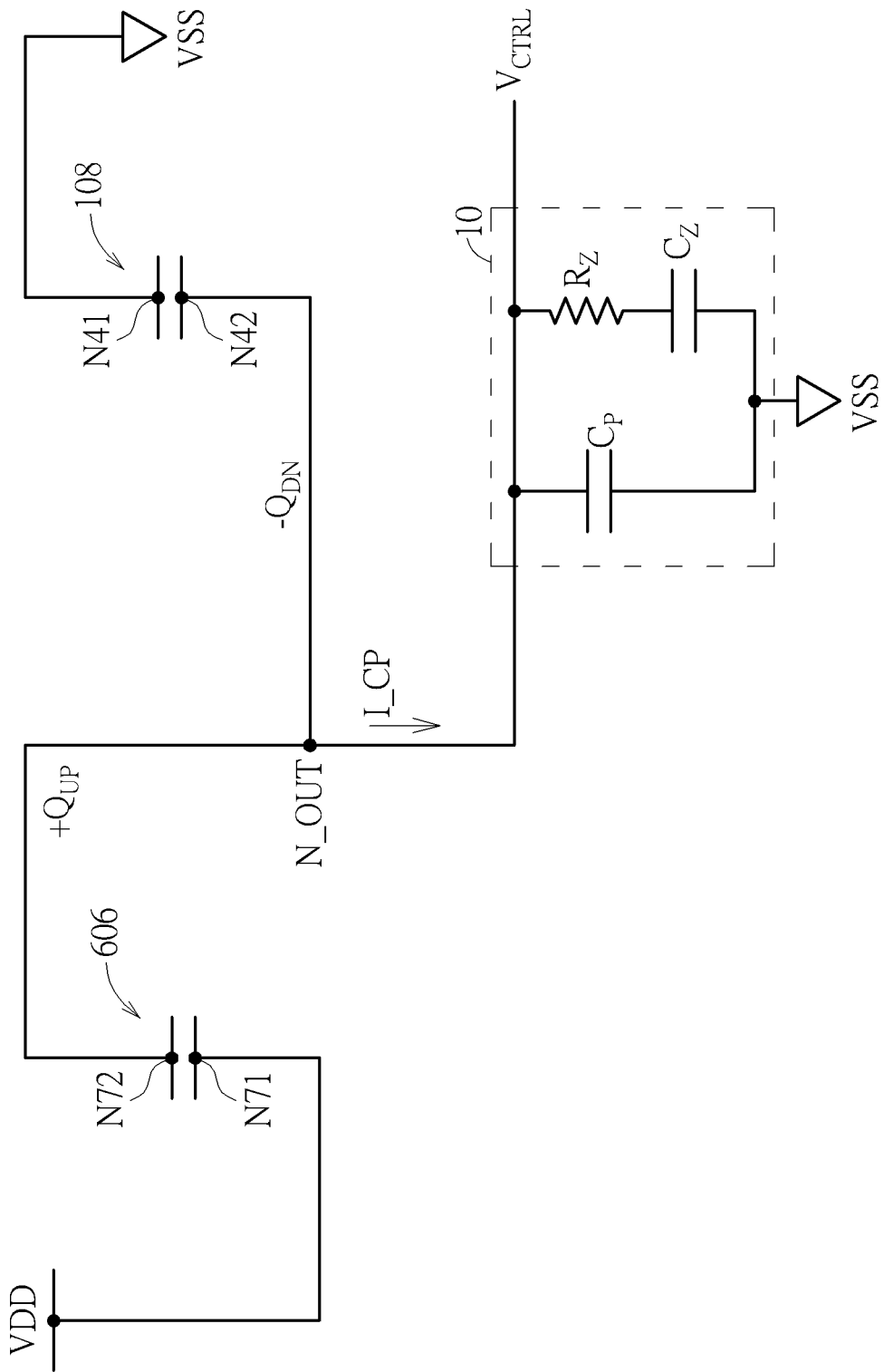
FIG. 12 is a diagram illustrating an equivalent circuit of the third charge pump circuit operating in a second mode according to an embodiment of the present invention.

FIG. 12 is a diagram illustrating an equivalent circuit of the charge pump circuit 1000 operating in the second mode MODE_2 according to an embodiment of the present invention. During the second mode MODE_2 of the charge pump circuit 1000, the interconnection circuit 1010 connects the plate N72 of the capacitor 606 to the output terminal N_OUT, connects the plate N42 of the capacitor 108 to the output terminal N_OUT, connects the plate N71 of the capacitor 606 to the power rail VDD, connects the plate N41 of the capacitor 108 to the power rail VSS, and disconnects the plate N72 of the capacitor 606 and the plate N42 of the capacitor 108 from the AC ground point (e.g., voltage output Vtune of buffer circuit 1012).

During a period in which the charge pump circuit 1000 operates in the second mode MODE_2, both of the control inputs UP and DN remain deasserted. Since the plate N71 of the capacitor 606 is coupled to the power rail VDD, the plate N41 of the capacitor 108 is coupled to the power rail VSS, and the plate N72 of the capacitor 606 is coupled to the plate N42 of the capacitor 108, charge sharing is performed for subtracting the electrical charge $Q_{DN}$ stored in the capacitor 108 from the electrical charge $Q_{UP}$ stored in the capacitor 606, thus resulting in the charge pump output I_CP. For example, the charge pump output I_CP may be a charging current for pulling up the control voltage $V_{CTRL}$ when $(Q_{UP}-Q_{DN})$ is positive, and may be a discharging current for pulling down the control voltage $V_{CTRL}$ when $(Q_{UP}-Q_{DN})$ is negative.

Certain features of the proposed charge pump (CP) circuit 1000 are listed in the following table.

TABLE 3

| | |
|---|---|
| CP noise | Good |
| Trade-off between operation range and noise performance | No |
| VDD noise | Required better VDD |
| Varactor density | Good |

As shown in FIG. 12, the plate N71 of the capacitor 606 is coupled to a supply voltage (e.g., +3.3V) provided by the power rail VDD, and the plate N41 of the capacitor 108 is coupled to a ground voltage (e.g., 0V) provided by the power rail VSS. Hence, after the charge pump circuit 1000 leaves the second mode MODE_2 and then enters the first mode MODE_1 again, the controllable current generating circuit 602 (which is implemented by using NMOS transistors only) is coupled between the supply voltage (e.g., +3.3V) and the ground voltage (e.g., 0V) at the time the controllable current generating circuit 602 is enabled by the asserted control input UP, and the controllable current generating circuit 104 (which is implemented by using PMOS transistors only) is coupled between the supply voltage (e.g., +3.3V) and the ground voltage (e.g., 0V) at the time the controllable current generating circuit 104 is enabled by the asserted control input DN. Since a large overdrive voltage is possessed by an NMOS transistor that is biased in a saturation mode to act as a current source, the noise resulting from the current source of the controllable current generating circuit 602 is reduced. Furthermore, since a large overdrive voltage is possessed by a PMOS transistor that is biased in a saturation mode to act as a current source, the noise resulting from the current source of the controllable current generating circuit 104 is reduced. In this way, the noise performance of the proposed charge pump circuit 1000 is good.

As shown in FIG. 12, none of the plate N71 of the capacitor 608 and the plate N41 of the capacitor 108 is coupled to the control voltage $V_{CTRL}$. Hence, after the charge pump circuit 1000 leaves the second mode MODE_2 and then enters the first mode MODE_1 again, the terminal N51 of the controllable current generating circuit 602 (which is implemented by using NMOS transistors only) is not coupled to the control voltage $V_{CTRL}$ ($V_{CTRL}$=Vtune) at the time the controllable current generating circuit 602 is enabled by the asserted control input UP, and the terminal N21 of the controllable current generating circuit 104 (which is implemented by using PMOS transistors only) is not coupled to the control voltage $V_{CTRL}$ ($V_{CTRL}$=Vtune) at the time the controllable current generating circuit 104 is enabled by the asserted control input DN. Since an overdrive voltage possessed by an NMOS transistor that is biased in a saturation mode to act as a current source is independent of the control voltage $V_{CTRL}$ ($V_{CTRL}$=Vtune), there is no trade-off between operation range of control voltage $V_{CTRL}$ and noise performance of the controllable current generating circuit 602. Furthermore, since an overdrive voltage possessed by a PMOS transistor that is biased in a saturation mode to act as a current source is independent of the control voltage $V_{CTRL}$ ($V_{CTRL}$=Vtune), there is no trade-off between operation range of control voltage $V_{CTRL}$ and noise performance of the controllable current generating circuit 104.

As shown in FIG. 12, the plate N72 of the capacitor 606 is coupled to the control voltage $V_{CTRL}$, while the plate N71 of the capacitor 606 is coupled to the supply voltage (e.g., +3.3V) provided by the power rail VDD. Since the plate N71 is coupled to the supply voltage (e.g., +3.3V) provided by the power rail VDD at the time the plate N72 is coupled to the control voltage $V_{CTRL}$, the control voltage $V_{CTRL}$ adjusted by the charge pump circuit 1000 and provided to the voltage-controlled oscillator 20 is not immune to noise of the supply voltage during the second mode MODE_2 of the charge pump circuit 1000. Thus, a low-noise supply voltage provided by the power rail VDD is required to protect the control voltage $V_{CTRL}$ from noise of the supply voltage.

As shown in FIG. 11, after the charge pump circuit 1000 leaves the second mode MODE_2 and then enters the first mode MODE_1 again, the controllable current generating circuit 602 (which is implemented by using NMOS transistors only) is coupled between the supply voltage (e.g., +3.3V) and the ground voltage (e.g., 0V) at the time the controllable current generating circuit 602 is enabled by the asserted control input UP, and the controllable current generating circuit 104 (which is implemented by using PMOS transistors only) is coupled between the supply voltage (e.g., +3.3V) and the ground voltage (e.g., 0V) at the time the controllable current generating circuit 104 is enabled by the asserted control input DN. Because a maximum voltage drop (e.g., 3.3V-0V) is across each of the controllable current generating circuits 602 and 104, noise performance optimization of current sources in the controllable current generating circuits 602 and 104 can be achieved regardless of the control voltage $V_{CTRL}$ ($V_{CTRL}$=Vtune). A PLL circuit using the charge pump circuit 1000 is allowed to have a wide operation range of the control voltage $V_{CTRL}$. For example, the operation range of the control voltage $V_{CTRL}$ may be from the ground voltage (e.g., 0V) to the supply voltage (e.g., +3.3V). In the embodiment shown in FIG. 10, the VCO 20 may be configured to have a small VCO gain $K_{VCO}$, thereby allowing the PLL circuit to enter a frequency locked state under a high control voltage $V_{CTRL}$. The capacitors $C_P$ and $C_Z$ of the loop filter 10 may be implemented by varactors. Since the control voltage $V_{CTRL}$ for the frequency locked state is high, the capacitance density (capacitance per unit area) of the varactor is good.

The proposed charge pump topology is capable of breaking the trade-off between $V_{CTRL}$ operation range and CP noise performance by swapping plates of capacitors. A current source can enjoy large headroom and have lower noise because a maximum voltage drop across a MOS-based current source is available. In addition, a large $V_{CTRL}$ operation range is allowed because the control voltage $V_{CTRL}$ is irrelevant to the headroom of the current source. In general, a high VCO gain results in high sensitivity to the noise of VCO control voltage, which increases the spur level and degrades the phase noise performance. The available $V_{CTRL}$ operation range allows the VCO gain to be as small as possible. Moreover, the proposed charge pump topology enables simple realization without calibration and/or reliability issue.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump circuit for adjusting a control voltage at an output terminal, comprising:
   a first capacitor, having a first plate and a second plate;
   a second capacitor, having a first plate and a second plate;
   a first controllable current generating circuit, having a first terminal and a second terminal, wherein the first terminal of the first controllable current generating circuit is coupled to the first plate of the first capacitor; and during a first operation mode of the charge pump circuit, the first controllable current generating circuit is arranged to refer to a first control input for selectively providing a first current passing through the first terminal and the second terminal of the first controllable current generating circuit;
   a second controllable current generating circuit, having a first terminal and a second terminal, wherein the first terminal of the second controllable current generating circuit is coupled to the first plate of the second capacitor; and during the first operation mode of the charge pump circuit, the second controllable current generating circuit is arranged to refer to a second control input for selectively providing a second current passing through the first terminal and the second terminal of the second controllable current generating circuit; and
   an interconnection circuit, wherein during a second operation mode of the charge pump circuit, the interconnection circuit is arranged to at least couple the first plate of the second capacitor to a first power rail without via the second plate of the second capacitor, and arranged to couple the first plate of the first capacitor to a second power rail without via the second plate of the first capacitor, and is further arranged to couple the second plate of the second capacitor to the output terminal of the charge pump circuit without via the first plate of the second capacitor, and arranged to couple the second plate of the first capacitor to the output terminal of the charge pump circuit without via the first plate of the first capacitor.

2. The charge pump circuit of claim 1, wherein during the first operation mode, the interconnection circuit is arranged to disconnect the second plate of the first capacitor from the output terminal of the charge pump circuit, and is further arranged to disconnect the second plate of the second capacitor from the output terminal of the charge pump circuit.

3. The charge pump circuit of claim 2, wherein during the first operation mode, the second terminal of the first controllable current generating circuit is coupled to the first power rail, and the second plate of the first capacitor is coupled to a voltage output.

4. The charge pump circuit of claim 3, wherein the voltage output is not delivered by any of the first power rail and the second power rail.

5. The charge pump circuit of claim 3, further comprising:
   a buffer circuit, arranged to generate the voltage output according to the control voltage at the output terminal of the charge pump circuit.

6. The charge pump circuit of claim 3, wherein the first power rail is arranged to deliver a ground voltage.

7. The charge pump circuit of claim 2, wherein during the first operation mode, the second terminal of the second controllable current generating circuit is coupled to the second power rail, and the second plate of the second capacitor is coupled to a voltage output.

8. The charge pump circuit of claim 7, wherein the voltage output is not delivered by any of the first power rail and the second power rail.

9. The charge pump circuit of claim 7, further comprising:
   a buffer circuit, arranged to generate the voltage output according to the control voltage at the output terminal of the charge pump circuit.

10. The charge pump circuit of claim 7, wherein the second power rail is arranged to deliver a supply voltage.

11. A method for adjusting a control voltage at an output terminal of a charge pump circuit, comprising:
    providing the charge pump circuit that comprises a first capacitor, a second capacitor, a first controllable current generating circuit, and a second controllable current generating circuit, wherein a first terminal of the first controllable current generating circuit is coupled to a first plate of the first capacitor, and a first terminal of the second controllable current generating circuit is coupled to a first plate of the second capacitor;
    during a first operation mode of the charge pump circuit, referring to a first control input for selectively enabling the first controllable current generating circuit to provide a first current passing through the first terminal and a second terminal of the first controllable current generating circuit, and referring to a second control input for selectively enabling the second controllable current generating circuit to provide a second current passing through the first terminal and a second terminal of the second controllable current generating circuit; and
    during a second operation mode of the charge pump circuit, coupling the first plate of the second capacitor to a first power rail without via a second plate of the second capacitor, coupling the first plate of the first capacitor to a second power rail without via a second plate of the first capacitor, coupling the second plate of the first capacitor to the output terminal of the charge pump circuit without via the first plate of the first capacitor, and coupling the second plate of the second capacitor to the output terminal of the charge pump circuit without via the first plate of the second capacitor.

* * * * *